US008278802B1

(12) United States Patent
Lee et al.

(10) Patent No.: US 8,278,802 B1
(45) Date of Patent: Oct. 2, 2012

(54) PLANARIZED SACRIFICIAL LAYER FOR MEMS FABRICATION

(75) Inventors: Seungbae Lee, Los Gatos, CA (US); Sheng-Shian Li, Yangmei Township (TW); Kushal Bhattacharjee, Kernersville, NC (US)

(73) Assignee: RF Micro Devices, Inc., Greensboro, NC (US)

( * ) Notice: Subject to any disclaimer, the term of this patent is extended or adjusted under 35 U.S.C. 154(b) by 340 days.

(21) Appl. No.: 12/429,455

(22) Filed: Apr. 24, 2009

Related U.S. Application Data

(60) Provisional application No. 61/047,477, filed on Apr. 24, 2008.

(51) Int. Cl.
*H01L 21/00* (2006.01)
(52) U.S. Cl. .................. 310/363; 310/311; 29/25.35
(58) Field of Classification Search .......... 310/363, 310/311; 29/25.35
See application file for complete search history.

(56) References Cited

U.S. PATENT DOCUMENTS

| 5,374,564 | A | 12/1994 | Bruel |
| 6,060,818 | A | 5/2000 | Ruby et al. |
| 6,355,498 | B1 * | 3/2002 | Chan et al. .......... 438/48 |
| 7,212,082 | B2 * | 5/2007 | Nagao et al. .......... 333/187 |
| 7,239,067 | B2 * | 7/2007 | Komuro et al. .......... 310/340 |
| 7,275,292 | B2 | 10/2007 | Ruby et al. |
| 2002/0034744 | A1 * | 3/2002 | Creager .......... 435/6 |
| 2004/0168519 | A1 * | 9/2004 | Kalvensten et al. .......... 73/727 |
| 2005/0184627 | A1 * | 8/2005 | Sano et al. .......... 310/363 |
| 2007/0200458 | A1 | 8/2007 | Yoshino et al. |
| 2008/0074005 | A1 * | 3/2008 | Sano et al. .......... 310/363 |

OTHER PUBLICATIONS

B. Aspar et al., "Smart-Cut® Process: An Original Way to Obtain Thin Films by Ion Implantation," (article), Sep. 17, 2000-Sep. 22, 2000, pp. 255-260, Conf. on Ion Implantation Tech. 2000.

Kirt R. Williams et al., "Etch Rates for Micromachining Processing—Part II," (article), Dec. 6, 2003, pp. 761-778, vol. 12, No. 6, Journal of Microelectromechanical Systems.

Michel Bruel, "Separation of silicon wafers by the smart-cut method," (article), Jun. 16, 1999, pp. 9-13, vol. 3, No. 1, Materials Research Innovations.

* cited by examiner

*Primary Examiner* — Walter Benson
*Assistant Examiner* — Bryan Gordon
(74) *Attorney, Agent, or Firm* — Withrow & Terranova, P.L.L.C

(57) ABSTRACT

A method of forming a device is provided. The method includes providing a substrate, forming a sacrificial layer over the substrate, and forming an field layer around the sacrificial layer. After formation, both the sacrificial layer and the field layer are planarized. A component is then formed over the planarized sacrificial layer and the planarized field layer. The component has a first electrode and a second electrode and a single crystal wafer disposed between the first electrode and the second electrode. The component also includes anchors disposed substantially over the field layer. Once the component is formed, the sacrificial layer is released with an etchant having a selectivity for the sacrificial layer such that a cavity is formed beneath the component. The cavity allows free movement component within the cavity during operation of the device. In addition, the etchant does not release the field layer and the component such that the field layer remains below the anchors.

18 Claims, 18 Drawing Sheets

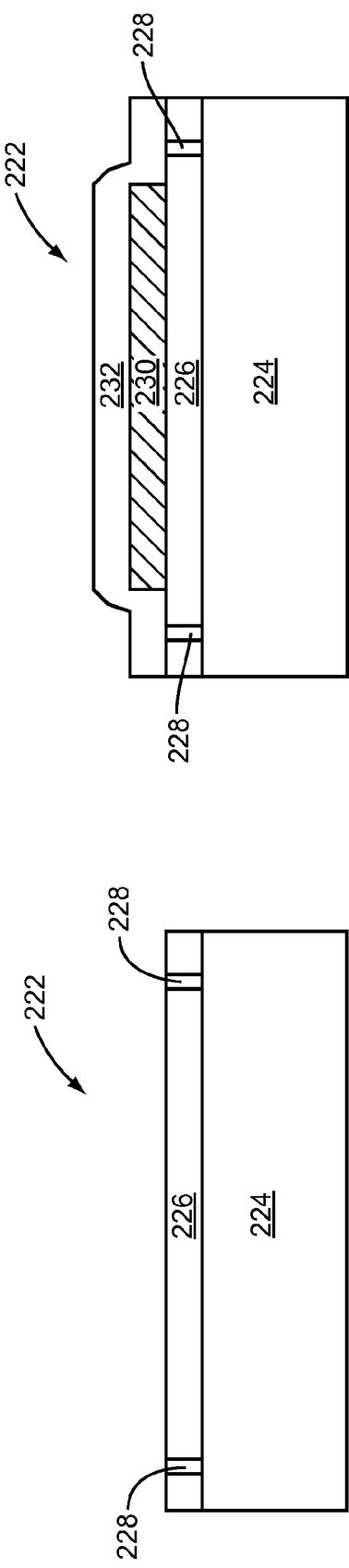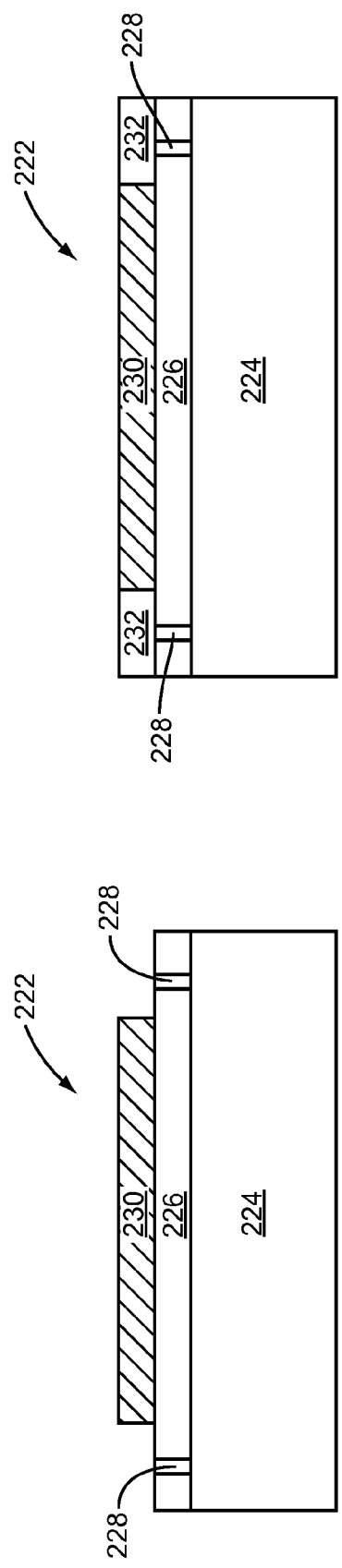

| Material / Etchant | Silicon (100) | Oxide Th-wet | Oxide PECVD | Nitride LPCVD | Nitride PECVD | Al Evap | Ti Sput | Cr Evap | Au Evap |
|---|---|---|---|---|---|---|---|---|---|
| Silicon etchant | 150 | 8.7 | 100 | 0.23 | 12 | 60 | 300 | R 8.8 | 0 |
| KOH, 80°C | 1100 | 7.7 | 15 | 0 | 0 | 12,900 | soft | 4.2 | 0 |
| 5:1 BHF | 0 | 100 | 490 | 1.3 | 8.2 | 11 | Work | 0 | 0 |
| $H_3PO_4$ | 0.17 | 0.18 | - | 2.7 | 20 | >500 | 980 | 100 | 0 |
| Al etchant | Slow | 0 | 0 | <0.05 | - | 530 | 660 | T 0 | - |
| Ti etchant | Slow | 12 | Work | Slow | - | 150 | 1100 | 0 | - |
| Dil. aqua regia | 0 | 0 | 0.7 | 0 | - | 600 | Work | 0 | 680 |
| $XeF_2$ | 460 | 0 | Slow | - | - | Slow | 29 | - | - |

- Silicon etchant: 126 $HNO_3$: 60 $H_2O$: 5 $NH_4F$, 20°C
- Ti etchant: 20 $H_2O$: 1 $H_2O_2$: 1 HF, 20°C
- Phosphoric Acid: $H_3PO_4$: 85%, 160°C
- Dilute Aqua regia: 3 HCl: 1 $HNO_3$: 2 $H_2O$, 30°C

*FIG. 38*

| Etchant / Sacrificial Layer | Amorphous-Silicon PECVD | Al Evap | Ti Sput | Vanadium Evap |
|---|---|---|---|---|
| Silicon — Isotropic (Trilogy) |  | 60 | 300 | 9600 |
| Silicon — Anisotropic (KOH) |  | 12,900 | soft | < 12 |
| Al etchant |  | 530 | 660 | - |
| Ti etchant |  | 150 | 1100 | - |
| Dil. aqua regia |  | 600 | Work | - |
| XeF$_2$ | 2000 | Slow | 29 | Work |

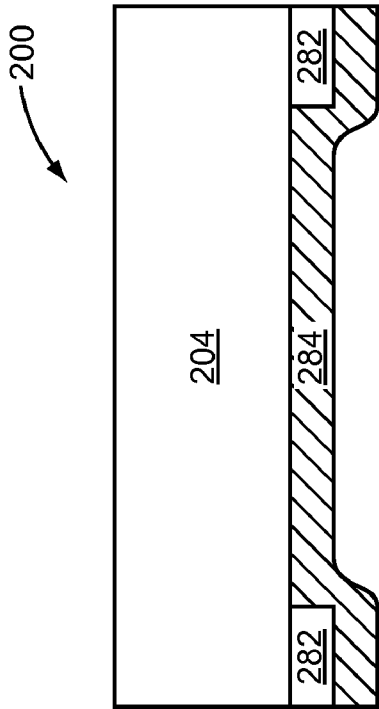
FIG. 40
FIG. 42
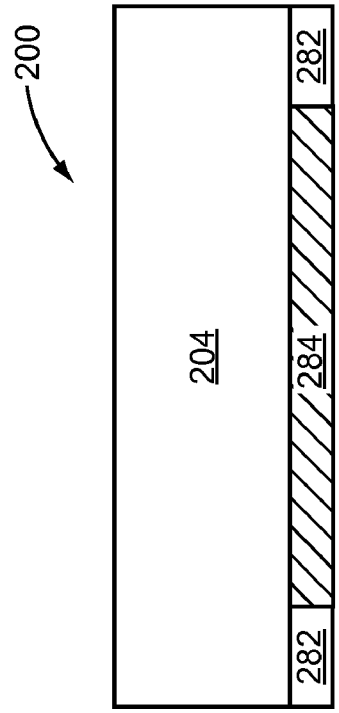
FIG. 43
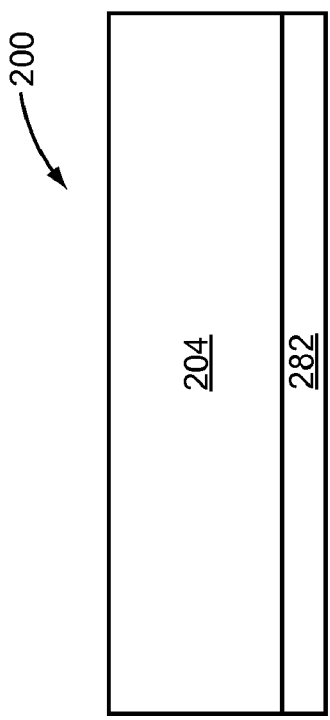
FIG. 41
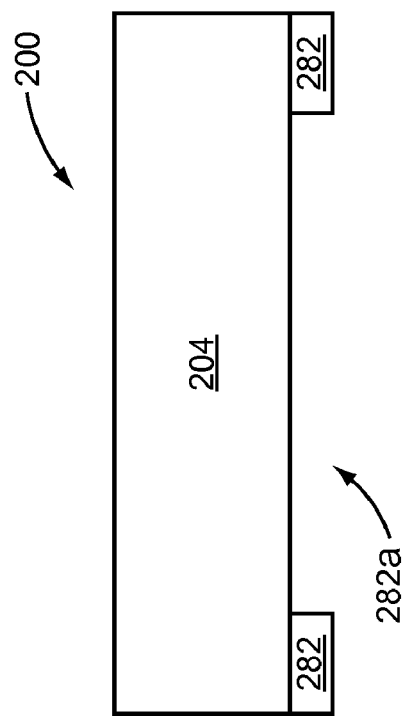

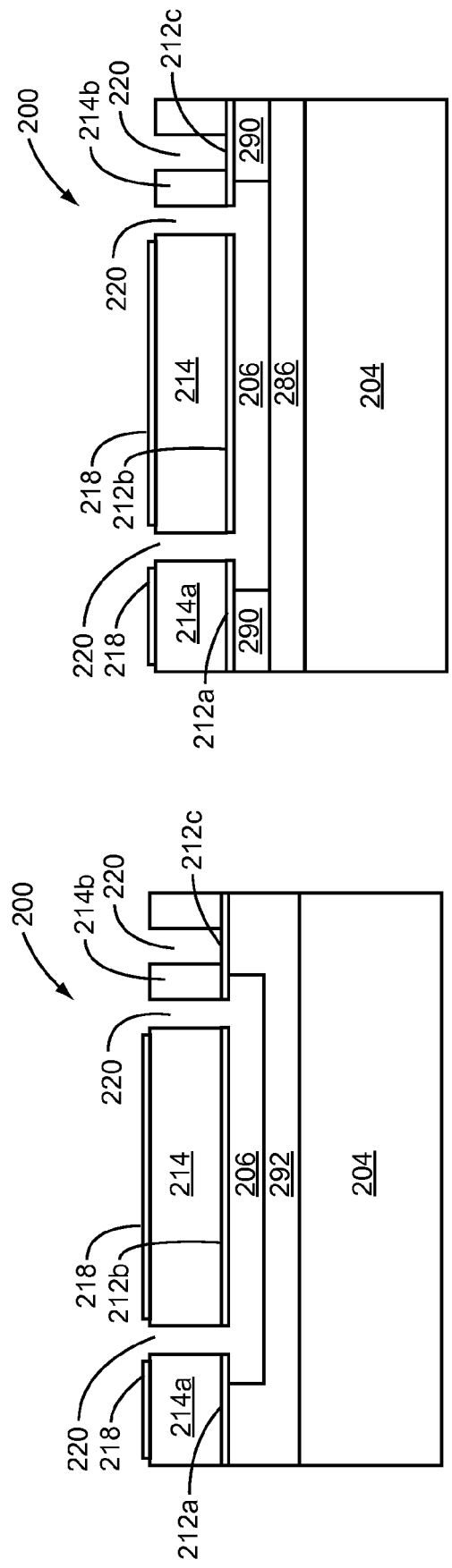

PLANARIZED SACRIFICIAL LAYER FOR MEMS FABRICATION

RELATED APPLICATION

This application claims the benefit of Provisional Patent Application Ser. No. 61/047,477, filed Apr. 24, 2008, the disclosure of which is hereby incorporated by reference in its entirety.

FIELD OF THE INVENTION

The present invention generally relates to Microelectromechanical (MEMS) devices and more particularly to forming a package for a semiconductor device or a MEMS device.

BACKGROUND OF THE INVENTION

Various types of micromechanical components operate best in an open area cavity. In particular, portions of MEMS devices, such as portions of MEMS resonators should be suspended in air within a device to maximize energy reflection between the MEMS resonator and air. In order to suspend a portion of a MEMS device in air, during fabrication, MEMS devices are formed over a sacrificial material, which is subsequently removed, thereby providing the MEMS device portion with free space and allowing movement. However, the sacrificial material is not removed in a controlled manner beneath the MEMS device. Thus, a release area formed where the sacrificial material was removed becomes too large. As such, the sacrificial material disposed under portions of the MEMS device, which do not require free space, such as anchors, is also removed. However, when the sacrificial material disposed under the anchors is removed, performance and stability of the MEMS device degrades, thereby degrading overall performance and reliability of the MEMS device.

In an effort to control the release area, one solution involves forming a cavity, which will provide an open area cavity and then forming the MEMS device over the cavity, as disclosed in U.S. Patent Application Publication No. 2007/0200458 A1 to Yoshino et al. In particular, a bottom electrode and a cavity are initially formed on a device. A piezoelectric substrate is then bonded to the device where the cavity is preformed and the piezoelectric device is thinned down. However, the piezoelectric substrate may warp at the region where the cavity is formed prior to thinning down. Furthermore, thinning down the piezoelectric substrate increases warping. Thus, performance of a device employing the warped piezoelectric substrate dramatically degrades, thereby making a device manufactured according to this method undesirable.

Accordingly, a need exists for a method of forming a MEMS device over a cavity while minimizing warping and controlling a release area of a sacrificial material used to form the cavity such that the cavity forms immediately below a resonator of the MEMS device. Moreover, a need exists for a method of forming a MEMS device having improved performance and improved reliability.

SUMMARY OF THE INVENTION

According to the present invention, a component is formed, where a cavity is formed below the component in order to allow movement of the component. Initially, a sacrificial layer and a field layer are deposited and patterned on a substrate and then planarized. The component, which may be a Microelectromechanical Systems (MEMS) resonator, is formed over the planarized sacrificial layer. Moreover, anchors of the component are formed substantially over the field layer. The sacrificial layer is then removed such that the field layer remains on the substrate around the area from which the sacrificial layer is removed. When the sacrificial layer is removed, the cavity is formed below the component, which allows movement of the component during operation. The field layer is formed on the substrate such that a substantial portion of the component anchors are formed over the field layer. Thus, when the sacrificial layer is removed, the component anchors remain anchored over the field such that the component anchors are not substantially disposed over the cavity, thereby improving anchoring of the component along with device performance and device stability.

Since the sacrificial layer is planarized, components formed on the sacrificial layer may easily integrate with different types of circuitries, such as CMOS circuitries. Specifically, the planar topography of the sacrificial layer minimizes the difficulties associated with patterning electrodes and other MEMS structures on the sacrificial layer. Furthermore, planarization of the sacrificial layer facilitates easily controlling the thickness of the component.

In accordance with an embodiment of the present invention, the sacrificial layers used to form the cavity in the MEMS device are formed with a material selected for its etching capabilities, such that during etching of the sacrificial layer, etching of other structures, such as the substrate, the field layer, and the component, is minimized.

Those skilled in the art will appreciate the scope of the present invention and realize additional aspects thereof after reading the following detailed description of the preferred embodiments in association with the accompanying drawing figures.

BRIEF DESCRIPTION OF THE DRAWING FIGURES

The accompanying drawing figures incorporated in and forming a part of this specification illustrate several aspects of the invention, and together with the description serve to explain the principles of the invention.

FIGS. 15-26 illustrate a process flow for integrating a movable MEMS device with CMOS circuitry in accordance with one embodiment of the present invention.

FIG. 38 shows a table comparing effects of various etchants on various materials, which may be used for a sacrificial layer, a field layer, and an electrode in accordance with one embodiment of the present invention.

FIGS. 40-43 illustrate a process flow for forming a planarized sacrificial layer for use with a MEMS device in accordance with a further embodiment of the present invention.

FIGS. 48-51, demonstrate the formation of a planarized sacrificial layer in accordance with another embodiment of the present invention.

FIG. 52 illustrates a MEMS device formed over a substrate having a planarized sacrificial layer in accordance with an embodiment of the present invention.

FIG. 53 illustrates an example of a MEMS device formed over planarized field layers in accordance with a further embodiment of the present invention.

DETAILED DESCRIPTION OF THE PREFERRED EMBODIMENTS

The embodiments set forth below represent the necessary information to enable those skilled in the art to practice the invention and illustrate the best mode of practicing the invention. Upon reading the following description in light of the accompanying drawing figures, those skilled in the art will understand the concepts of the invention and will recognize applications of these concepts not particularly addressed herein. It should be understood that these concepts and applications fall within the scope of the disclosure and the accompanying claims.

According to the present invention, a component is formed, where a cavity is formed below the component in order to allow movement of the component. Initially, a sacrificial layer and an field layer are deposited and patterned on a substrate and then planarized. The component, which may be a Microelectromechanical Systems (MEMS) resonator, is formed over the planarized sacrificial layer. Moreover, anchors of the component are formed substantially over the field layer. The sacrificial layer is then removed such that the field layer remains on the substrate around the area from which the sacrificial layer is removed. When the sacrificial layer is removed, the cavity is formed below the component, which allows movement of the component during operation. The field layer is formed on the substrate such that a substantial portion of the component anchors are formed over the field layer. Thus, when the sacrificial layer is removed, the component anchors remain anchored over the field such that the component anchors are not substantially disposed over the cavity, thereby improving anchoring of the component along with device performance and device stability.

Figure 1:
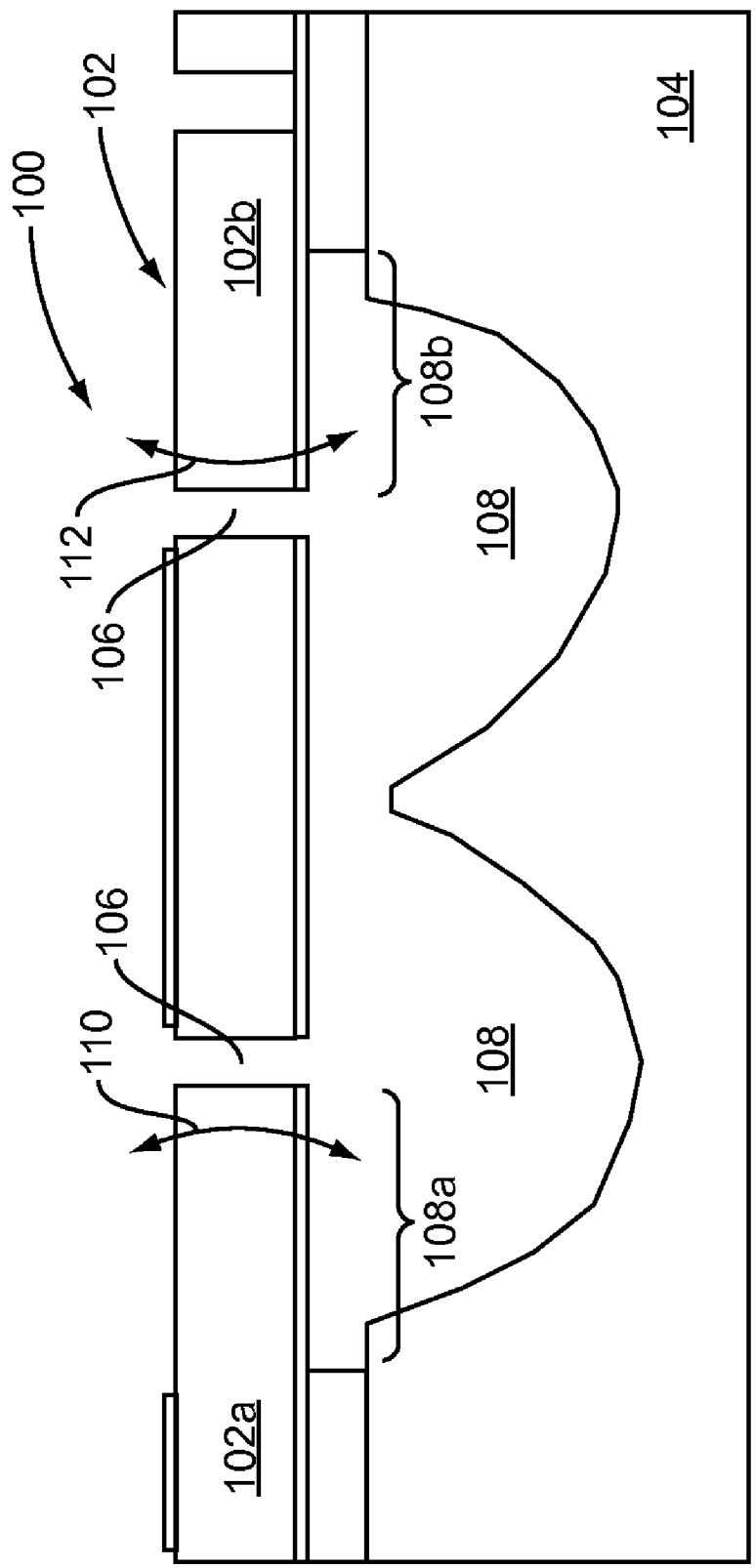
FIG. 1 illustrates the formation of a Microelectromechanical Systems (MEMS) device.

FIG. 1 illustrates a device 100 where a MEMS device 102 is formed over a substrate 104. The device 100 is created by forming the MEMS device 102 over the substrate 104. The sacrificial material, which is the substrate 104, is then removed through paths 106 such that a cavity 108 is formed. However, as may be seen with reference to FIG. 1, the cavity 108 extends below MEMS device anchors 102a and 102b of the MEMS device 102 such that the anchor 102a extends over cavity portion 108a and the anchor 102b extends over cavity portion 108b. Thus, during operation of the device 100, the anchors 102a and 102b may move in any direction, such as a direction indicated by arrows 110 and 112. Movement of the anchors 102a and 102b as shown in FIG. 1 degrade overall performance and reliability of the device 100. Accordingly, minimizing formation of cavity portions below the MEMS device anchors 102a and 102b is desirable in order to improve performance and reliability of a MEMS device.

Figure 2:
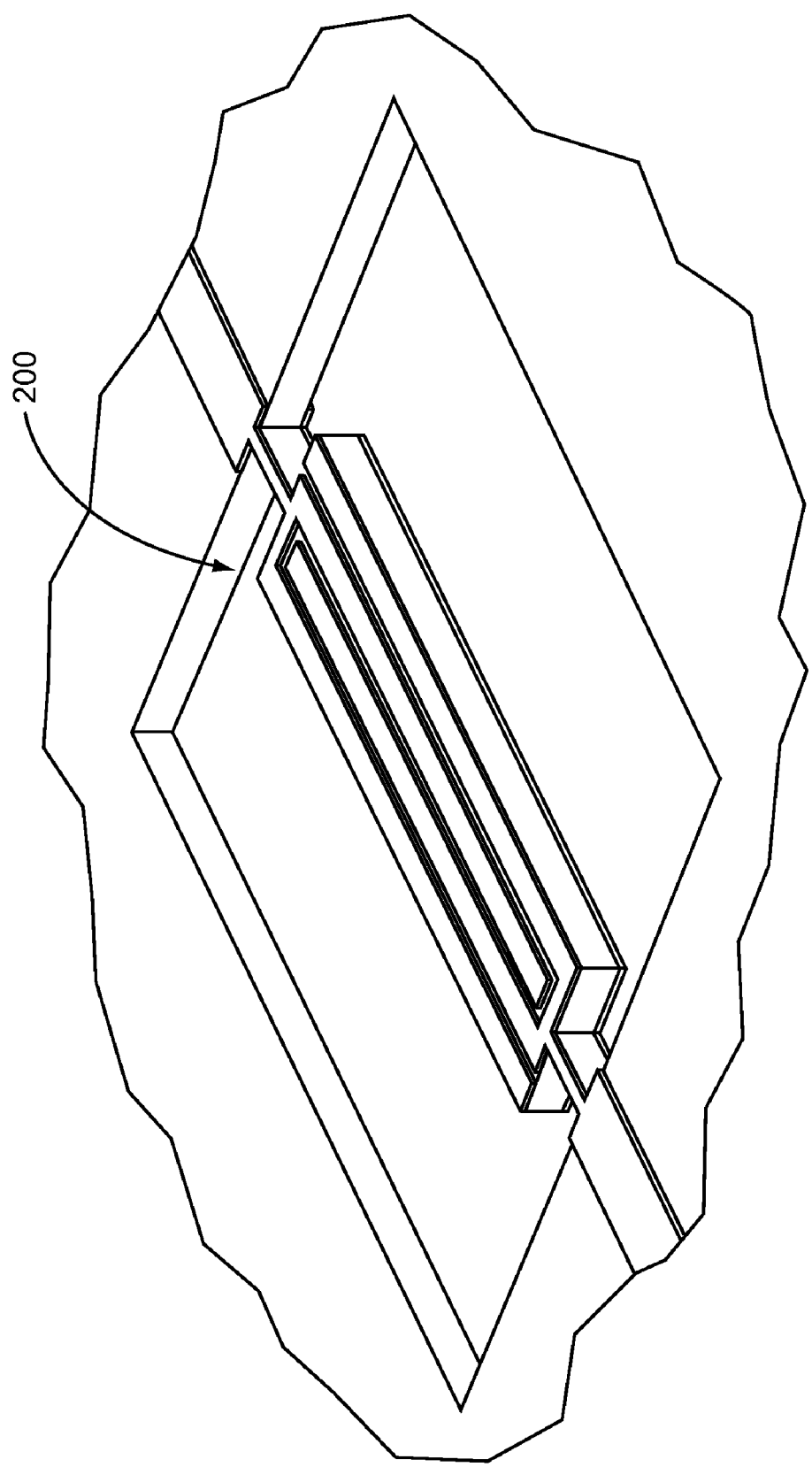
FIG. 2 illustrates a MEMS device formed in accordance with one embodiment of the present invention.

FIG. 2 illustrates a device 200 formed in accordance with an embodiment of the present invention. The device 200 may be any type of MEMS structure, including a MEMS resonator, such as an electrostatically transduced resonator, a film bulk acoustic resonator, a piezoelectric resonator, or the like. The device 200 may also include a gyroscope, an accelerometer, or the like. As will be explained in further detail with reference to FIGS. 3-53, the device 200 is formed over a cavity, which allows for movement of the device 200 during operation. Additionally, as may be seen with reference to FIG. 2, the device 200 includes two top electrodes and a bottom electrode, where the top electrodes are both formed on the same level on a top surface of a substrate of the device 200. Furthermore, as will be detailed below, a MEMS device formed in accordance with FIGS. 3-53 includes cavities that do not substantially extend below anchors of the device.

Figure 3:
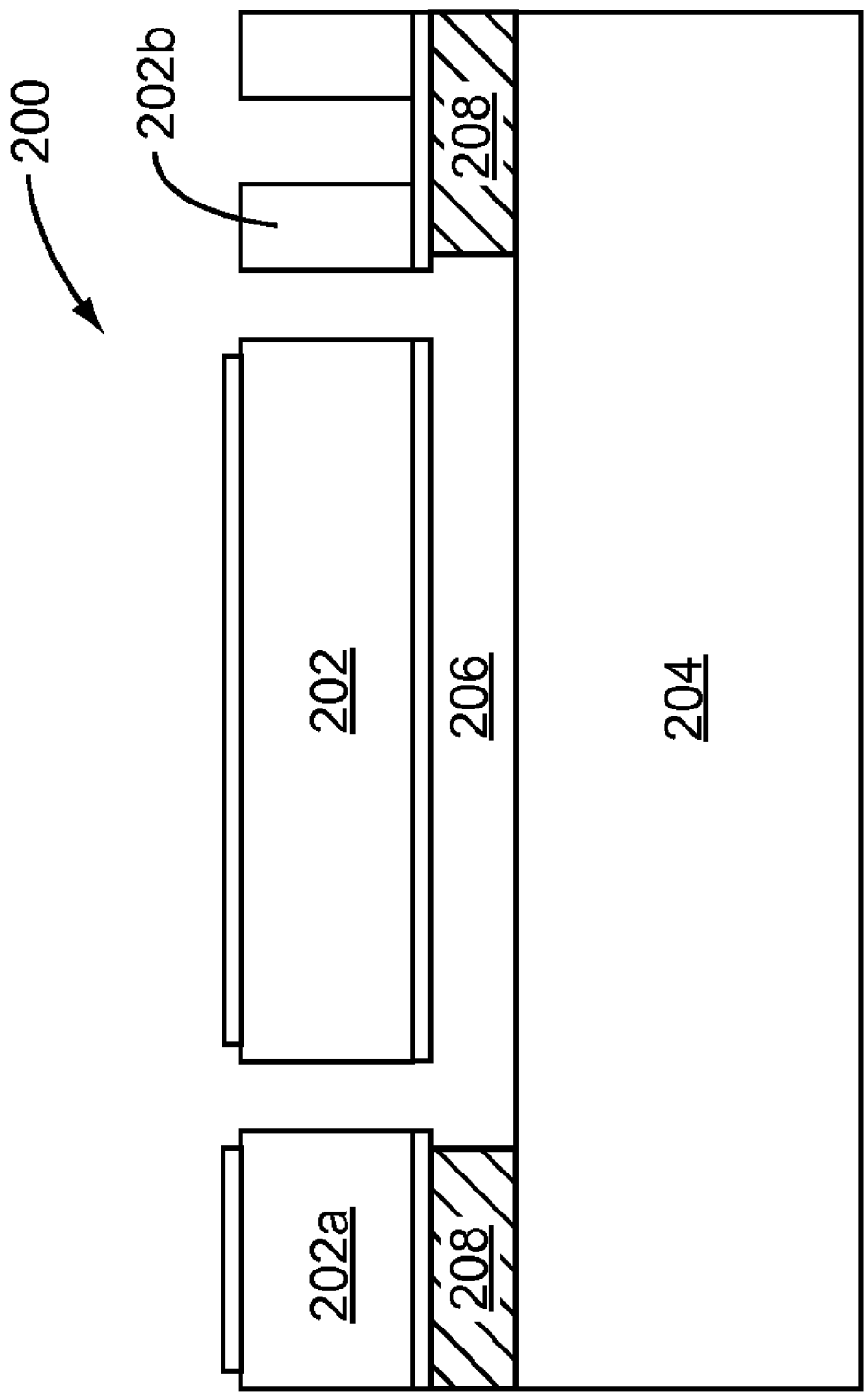
FIG. 3 shows a schematic view of the MEMS device shown with reference to FIG. 2 in accordance with one embodiment of the present invention.

To further illustrate, now making reference to FIG. 3, a schematic view of the device 200 shown with reference to FIG. 2 is illustrated in accordance with an embodiment of the present invention. The device 200 includes MEMS device 202 having anchors 202a and 202b. The device 200 is formed over a substrate 204 and a cavity 206. As will be detailed further on, the cavity 206 is formed when sacrificial material is removed from an area immediately below the MEMS device 202 after formation of the MEMS device 202. The cavity 206 allows for free vibrational movement of the MEMS device 202 when a semiconductor device incorporating the device 200 is used. Furthermore, the anchors 202a and 202b of the MEMS device 202 are formed substantially over a field layer 208, thereby improving the performance stability of the MEMS device 202. In one embodiment of the present invention, the field layer may be an oxide layer. Specifically, the anchors 202a and 202b are formed such that they do not move during operation of the device 200. The MEMS device 202 and the cavity 206 may be formed using a technique shown with reference to FIGS. 4-14.

FIGS. 4-14 illustrate a process flow for fabrication of a movable MEMS device in accordance with one embodiment of the present invention. In this embodiment, a process flow for MEMS fabrication utilizing the bonding of a single crystal wafer is shown. Here, a MEMS device is fabricated such that the MEMS device has an off-chip configuration. Specifically, the embodiments discussed with reference to FIGS. 4-14 may be used with a stand alone device. Initially, a sacrificial layer 210 is deposited over the substrate 204 using any well-known technique. Upon deposition of the sacrificial layer 210, the sacrificial layer is patterned and etched such that the sacrificial layer 210 has the configuration shown with reference to FIG. 4. The sacrificial layer 210 may be patterned and subsequently etched using any suitable technique known in the art. As will be discussed later on, the sacrificial layer 210 will be removed upon formation of a MEMS device, such that removal of the sacrificial layer 210 forms the cavity 206, shown in FIG. 3.

Figure 6:
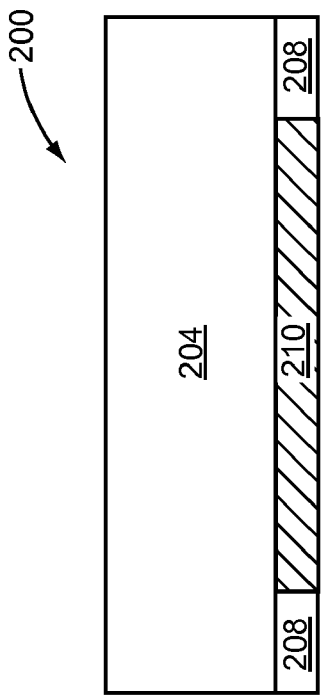
FIGS. 4-14 illustrate a process flow for fabrication of a movable MEMS device in accordance with one embodiment of the present invention.
Figure 7:
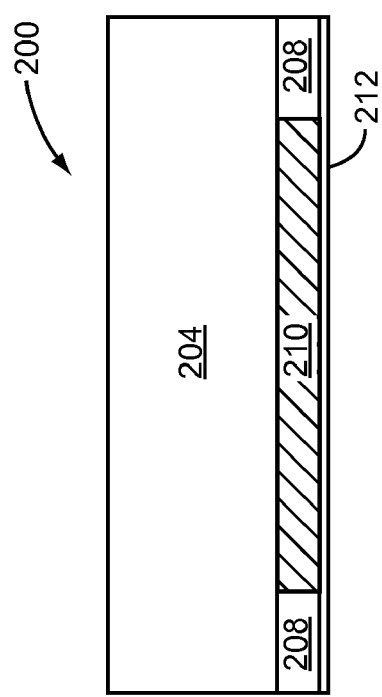
Figure 4:
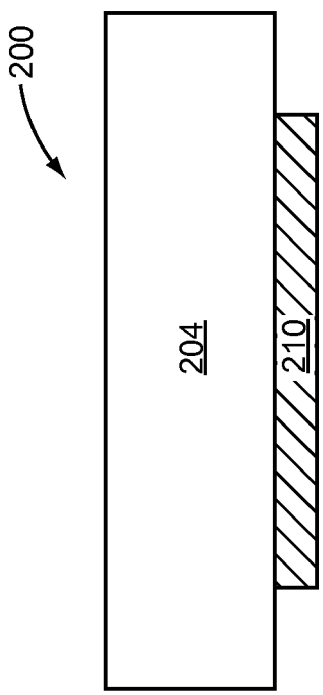
Figure 5:
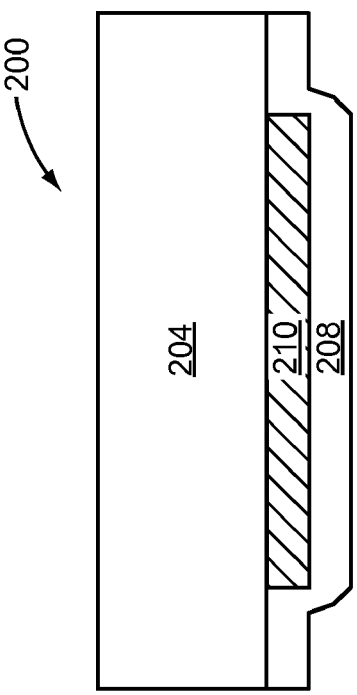

The field layer 208 is then deposited over the patterned sacrificial layer 210, as shown in FIG. 5. The field layer 208 may be deposited over and around the sacrificial layer 210 such that a field area of the substrate 204, i.e., an area of the substrate 204 patterned with the sacrificial layer 210, is also covered. Upon deposition of the field layer 208, both the field layer 208 and the sacrificial layer 210 are planarized using any suitable technique, including chemical mechanical polishing, or the like, such that the field layer 208 and the sacrificial layer 210 have a planarized configuration, as shown in FIG. 6. After planarization, a bottom electrode 212 is formed, where the bottom electrode 212 covers both the field layer 208 and the sacrificial layer 210, as shown in FIG. 7. In one embodiment of the present invention, Chromium may be used as the bottom electrode 212. However, it should be noted that any conductive material, such as Aluminum, Gold, Titanium, or the like, may be used for the bottom electrode 212 in accordance with embodiments of the present invention.

Figure 8A:
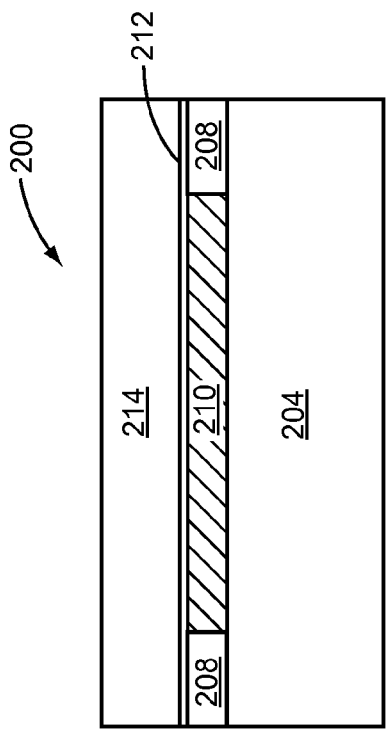

After formation of the bottom electrode 212, a single crystal wafer 214 is bonded over the bottom electrode 212 using any well-known technique, as shown in FIG. 8A. In one embodiment, the single crystal wafer 214 may be a piezoelectric wafer such as lithium tantalate (LT) or lithium niobate (LN). However, it should be noted that other materials may also be used for the single crystal wafer 214, such as Quartz, Langasite, Langanate, Langatate, Lithium Tetraborate, Potassium Niobate, or the like. The single crystal wafer 214 initially may have any thickness convenient for handling the substrate for processing but will have to be reduced ultimately to a thickness in a range of about 0.5 µm to about 5.0 µm.

Figure 8B:
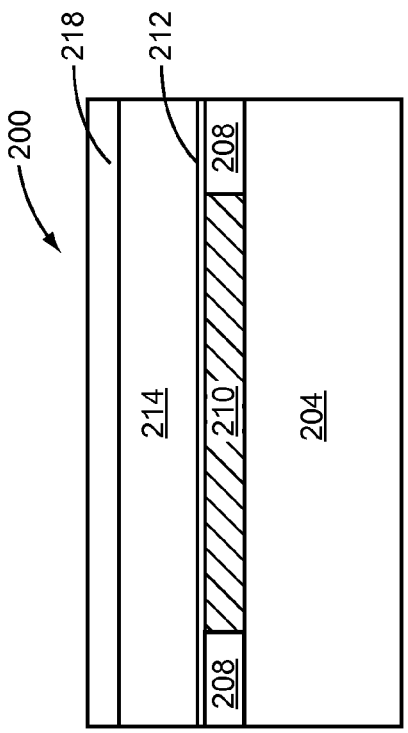

In an alternate embodiment, besides forming the single crystal wafer 214, a piezoelectric device 216 may be bonded to the bottom electrode 212 using a eutectic technique as shown in FIG. 8B. Here, the piezoelectric device 216 is formed at a required thickness prior to bonding, such that the piezoelectric device 216 does not need to be thinned down. The piezoelectric device 216 may be formed to a thickness between about 0.05 µm and about 5.0 µm, and more preferably about one micron (1 µm).

Figure 9:
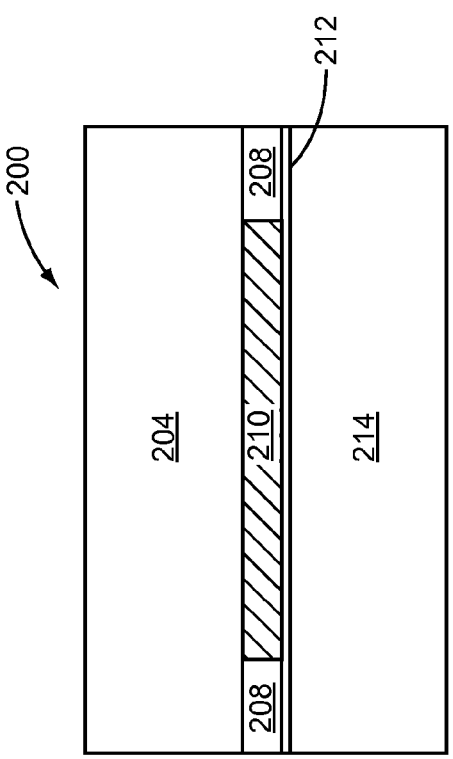

Upon formation of the single crystal wafer 214 over the bottom electrode 212, the single crystal wafer 214 is thinned down using any suitable technique, such as ion slicing, or the like, as shown with reference to FIG. 9. It should be noted that in FIG. 9, the device 200 has been flipped. The single crystal wafer 214 is thinned down such that a thickness of the single crystal wafer 214 is in a range of about 0.05 µm to about 5.0 µm, and more preferably about one micron (1 µm). The single crystal wafer 214 may also be thinned down using grinding or polishing techniques described in U.S. Patent Application Publication No. 2007/0200458 A1 to Yoshino et al.

Figure 10:
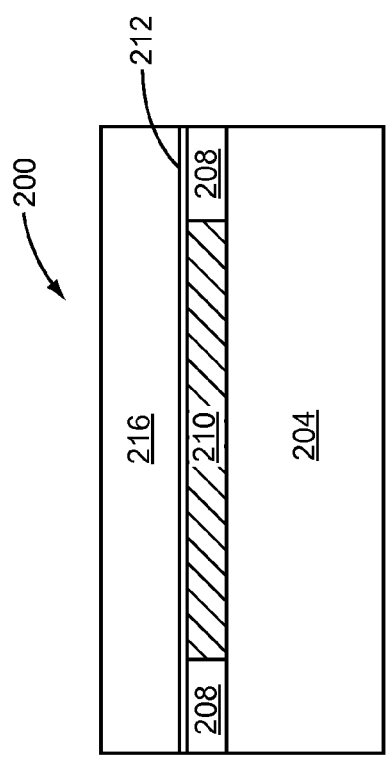
Figure 11:
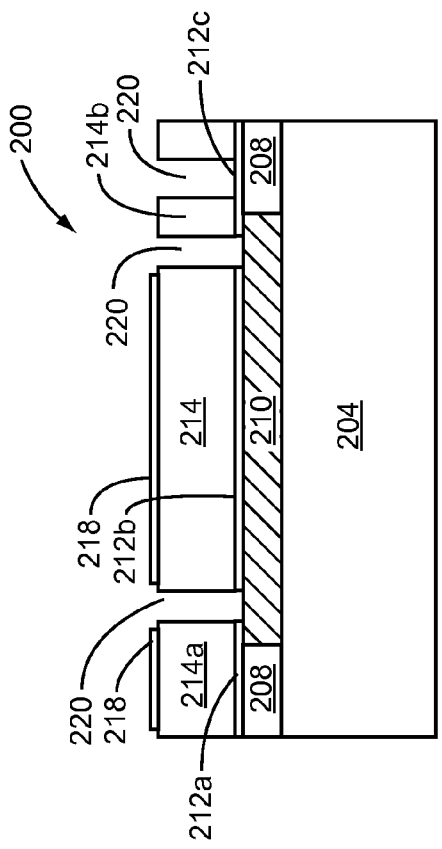

After the single crystal wafer 214 is thinned down, a top electrode 218 is formed over the single crystal wafer 214, as shown in FIG. 10. In one embodiment of the present invention, the top electrode 218 may serve as both an electrode and a hard mask. In an embodiment where the top electrode 218 functions as a hard mask, the hard mask may be used for etching the single crystal wafer 214. After formation, the top electrode 218 is patterned using any well-known technique. After the top electrode 218 is patterned, the single crystal wafer 214 is also patterned using the top electrode 218 as a hard mask, as shown in FIG. 11. In an embodiment where the top electrode 218 functions as a hard mask, the top electrode 218 may be patterned such that upon etching the top electrode 218, anchors 214a and 214b, and paths 220 are formed. The paths 220 may be used to pattern the bottom electrode 212, as shown in FIG. 12.

Figure 12:
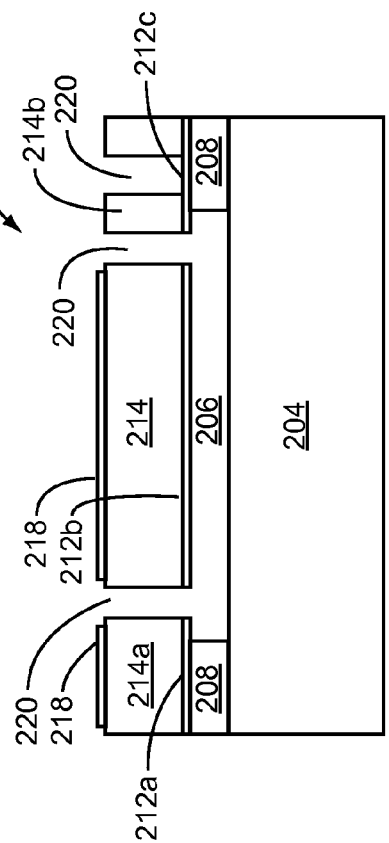

Now making reference to FIG. 12, the bottom electrode 212 is patterned using the top electrode 218 as a patterning mask. Here, the bottom electrode 212 is patterned such that the bottom electrode 212 and the single crystal wafer 214 are self-aligned. In addition, the bottom electrode 212 is patterned such that the bottom electrode 212 includes portions 212a, 212b, and 212c. The portion 212a of the bottom electrode 212 is disposed beneath the anchor 214a of the single crystal wafer 214. The portion 212b of the bottom electrode 212 is disposed beneath the single crystal wafer 214. The portion 212c of the bottom electrode 212 is disposed beneath the anchor 214b of the single crystal wafer 214.

Figure 13:
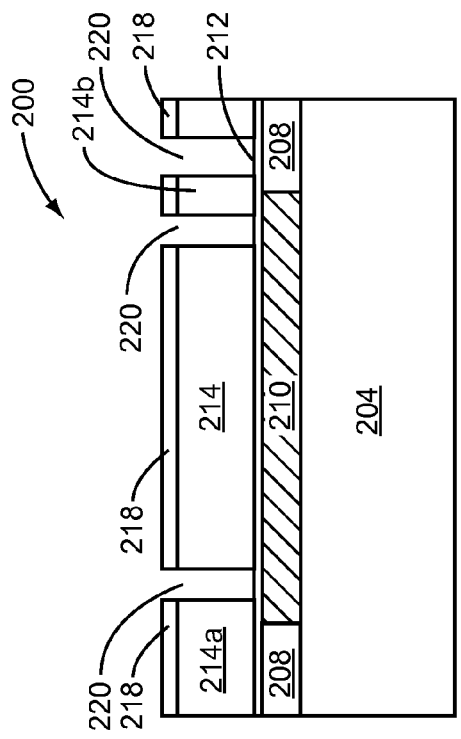
Figure 14:
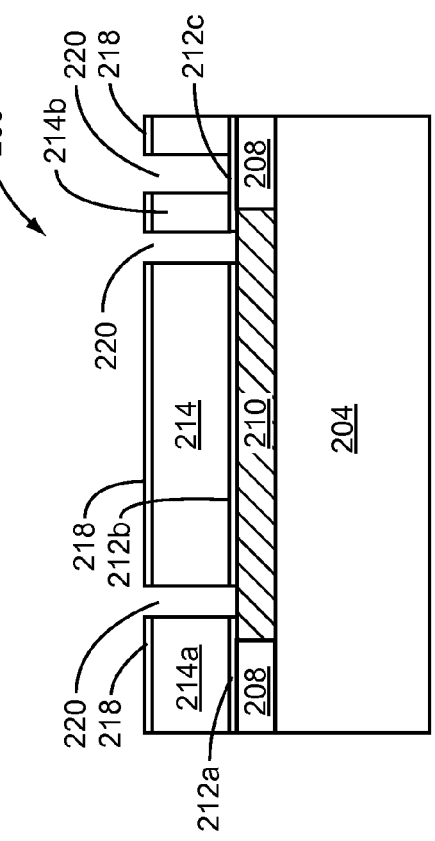

After the bottom electrode 212 is patterned, the top electrode 218 is etched such that the top electrode 218 has the configuration shown in FIG. 13. As may be seen with reference to FIG. 13, the bottom electrode 212 and the top electrode 218 are patterned such that outside an active area between the top and bottom electrodes 212 and 218 where the active area between the top and bottom electrodes 212 and 218 is defined by the single crystal wafer 214, overlap between the top and bottom electrodes 212 and 218 is minimized in order to reduce parasitic capacitance. Specifically, the top electrode 218 is patterned such that the bottom electrode 218 remains over the anchor 214a and the single crystal wafer 214. Furthermore, when the bottom electrodes 212 and 218 are patterned as shown in FIG. 13, a MEMS device is formed. The sacrificial layer 210 is released such that the device 200 has a configuration shown with reference to FIG. 14. When the sacrificial layer 210 is released, the cavity 206 is formed underneath the MEMS device. Thus, the MEMS device may freely move during operation of the device 200. As will be detailed further on, the sacrificial layer 210 is selected based on its selectivity to a particular release etchant. Thus, the etchant used to release the sacrificial layer 210 will not react with either the substrate 204 or any other structure disposed on the substrate 204, such as the MEMS device, the field layer 208, or the bottom and top electrodes 212 and 218. Moreover, as the field layer 208 is not released, the anchors 214a and 214b remain disposed over the field layer 208 such that the anchors 214a and 214b do not move during operation of the device 200.

Now making reference to FIGS. 15-26, a process flow for integrating a movable MEMS device with complementary metal oxide semiconductor (CMOS) circuitry is shown in accordance with a further embodiment of the present invention. As will be detailed further on, a movable MEMS device is fabricated on top of a CMOS device. In addition, the movable MEMS device is electrically connected with the CMOS device through vias formed in a field layer, such as an oxide layer. FIG. 15 illustrates the formation of a device 222 in accordance with this embodiment. Initially, a CMOS device 224 is provided and a field layer 226 is formed over the CMOS device 224. In one embodiment, the field layer 226 may be an oxide layer. Furthermore, vias 228 are formed in the field layer 226. In accordance with an embodiment of the present invention, both the field layer 226 and the vias 228 are formed using any suitable technique. The vias 228 may be used to provide an electrical path between the CMOS device 224 and a structure disposed above the field layer 226.

Upon formation of the field layer 226 and the vias 228, a sacrificial layer 230 is deposited and patterned over the field layer 226 as shown with reference to FIG. 16. In one embodiment of the present invention, the sacrificial layer 230 may comprise silicon. As will be discussed further on, the sacrificial layer 230 will be released thereby forming a cavity within which a MEMS structure may move during operation of the device 222. The sacrificial layer 230 may be deposited and patterned using any suitable technique.

Figure 19:
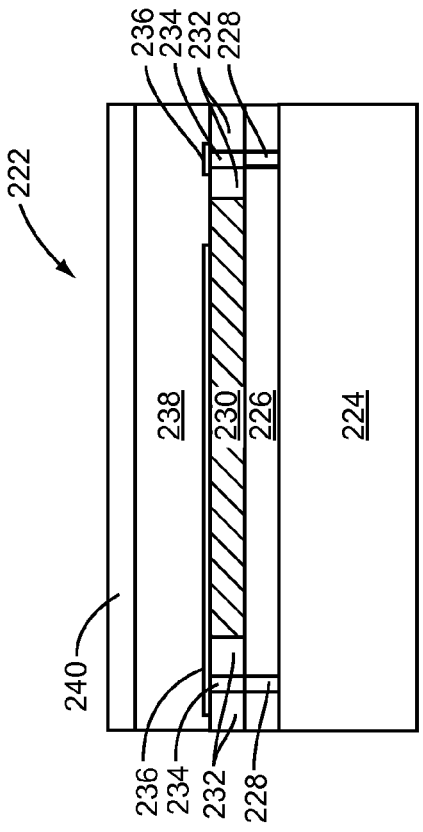

Now making reference to FIG. 17, a field layer 232, which may be an oxide layer in one embodiment, is deposited over the sacrificial layer 230 and planarized using a chemical mechanical polishing technique or any other suitable technique such that both the sacrificial layer 230 and the field layer 232 have the planar configuration shown in FIG. 18. Upon planarization of the field layer 232 and the sacrificial layer 230, vias 234 are formed within the field layer 232, as shown with reference to FIG. 19, using any suitable technique. The vias 234 are formed such that the vias 234 operatively couple with the vias 228 and the CMOS device 224, thereby forming an electrical path to the CMOS device 224, as shown in FIG. 19.

Figure 20:
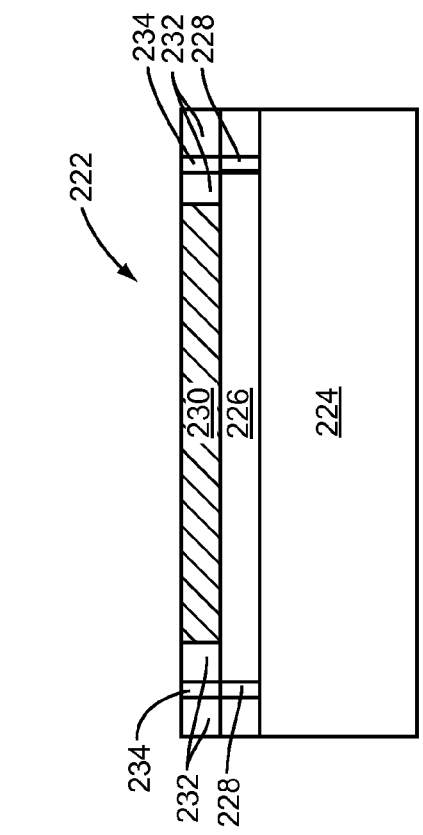
Figure 21:
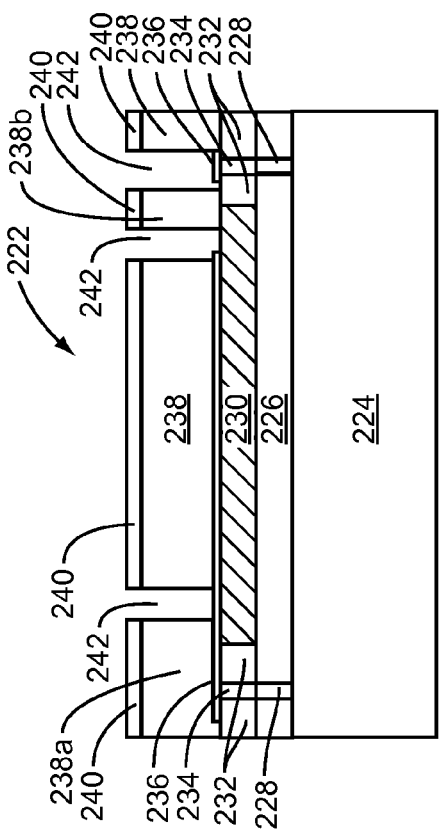

A bottom electrode 236 is then deposited and patterned over the sacrificial layer 230 and the field layer 232, as shown in FIG. 20. The bottom electrode 236 may be formed over the sacrificial layer 230 and the field layer 232 in a manner similar to that used to form the bottom electrode 212 discussed with reference to FIGS. 7-14. After the bottom electrode 236 is formed, a MEMS structural layer 238 is formed over the bottom electrode 236 as shown in FIG. 21. In accordance with one embodiment, the MEMS structural layer 238 may be formed at a thickness of approximately one micron (1 μm). However, it should be noted that the MEMS structural layer 238 may be formed at any thickness suitable for the needs of a semiconductor device employing the device 222.

Figure 22:
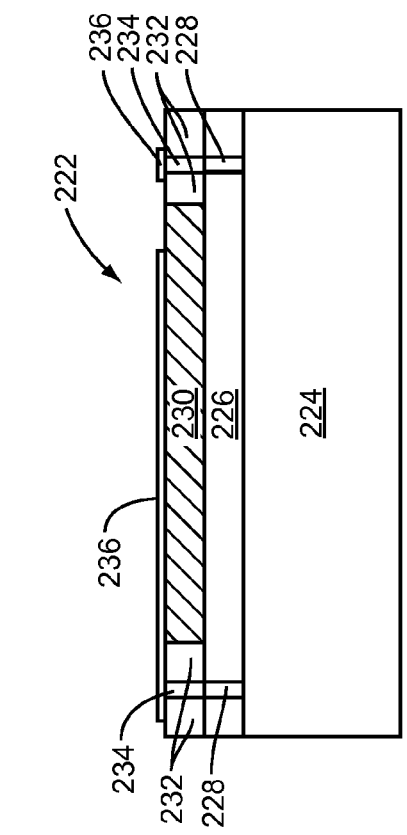

A top electrode 240 is then formed over the MEMS structural layer 238 in a manner similar to that used to form the top electrode 218. In one embodiment of the present invention, the top electrode 240 may be deposited to a thickness between a range of about 0.05 μm to about 2.0 μm. In accordance with embodiments of the present invention, the top electrode 240 may function as a hard mask. After deposition of the top electrode 240, the top electrode 240 is patterned using any suitable technique as shown in FIG. 22. In addition, anchors 238a and 238b and paths 242 are formed in the MEMS structural layer 238 when the top electrode 240 is patterned, as shown with reference to FIG. 22. In an embodiment where the top electrode 240 does not function as a hard mask, the paths 242, and consequently the anchors 238a and 238b, may be formed using any well-known technique. The paths 242 may assist with the patterning of the bottom electrode 236, as shown in FIG. 23.

Figure 23:
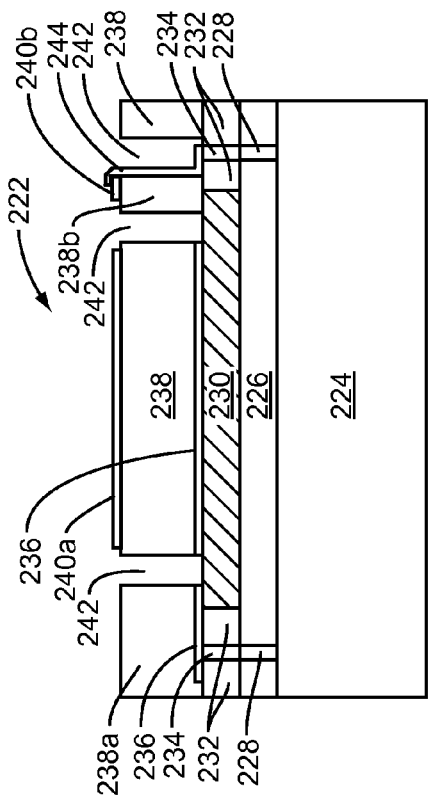

Now making reference to FIG. 23, after patterning of the MEMS structural layer 238 and the top electrode 240, the bottom electrode 236 is patterned. Here, the bottom electrode 236 is patterned such that the bottom electrode 236 and the MEMS structural layer 238 are self-aligned.

Figure 24:
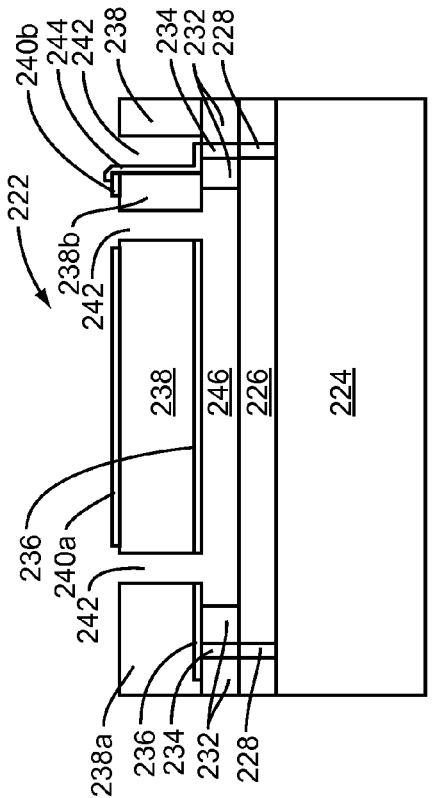
Figure 25:
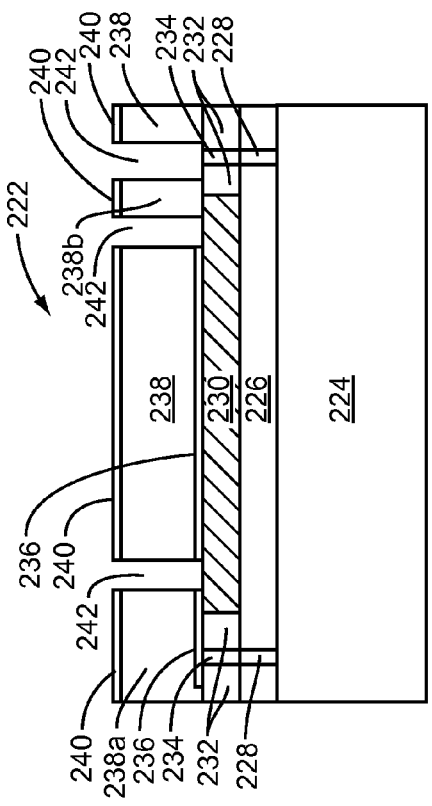
Figure 26:
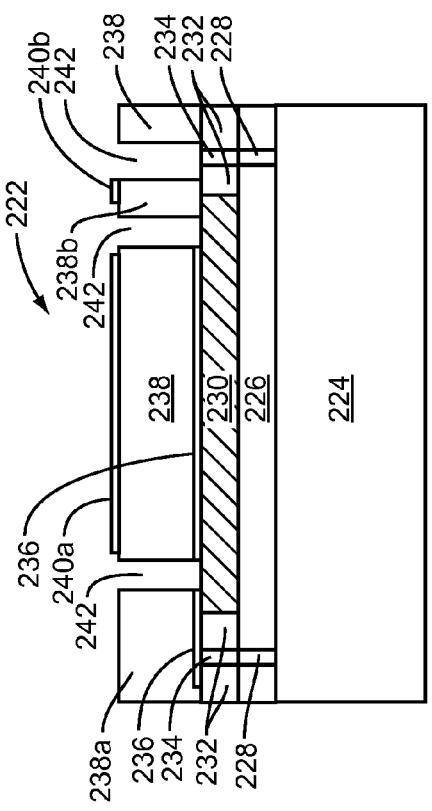

Now making reference to FIG. 24, the top electrode 240 may be patterned using the techniques discussed above with reference to the top electrode 218. Here, the top electrode 240 is patterned such that only electrode pads are formed, such as pads 240a and 240b, thereby reducing parasitic capacitances. To further illustrate, as may be seen with reference to FIG. 24, the bottom electrode 236 and the top electrode 240 are patterned and etched such that outside an active area between the top and bottom electrodes 236 and 240 where the active area between the top and bottom electrodes 236 and 240 is defined by the MEMS structural layer 238 and the anchor 238b, overlap between the top and bottom electrodes 236 and 240 is minimized in order to reduce parasitic capacitance. Specifically, the top electrode 240 is patterned and etched such that the bottom electrode 240 remains over the anchor 238b and the MEMS structural layer 238. Furthermore, when the top electrode 240 is patterned, a MEMS device that includes the bottom and top electrodes 236 and 240 and the MEMS structural layer 238 is formed. After the top electrode 240 is patterned, an electrical contact 244 is formed as shown with reference to FIG. 25. The electrical contact 244 may be formed using any technique well-known in the art. The electrical contact 244 operatively couples the top electrode 240 with the CMOS device 224 through the vias 228 and 234. Once the electrical contact 244 is formed, the sacrificial layer 230 is released as shown with reference to FIG. 26. The sacrificial layer 230 may be released in any manner as discussed above with reference to the sacrificial layer 210. Specifically, the sacrificial layer 230 may be removed with either a liquid or vapor etchant, thereby releasing the sacrificial layer 230. After the sacrificial layer 230 is released from the device 222, a cavity 246 is formed underneath the MEMS device formed by the bottom and top electrodes 236 and 240 and the MEMS structural layer 238. Moreover, as may be seen with reference to FIG. 26, the field layer 232 remains underneath the anchors 238a and 238b. Thus, during operation of the device 222, the MEMS device may freely move within the cavity 246 while the anchors 238a and 238b remain static.

Figure 27:
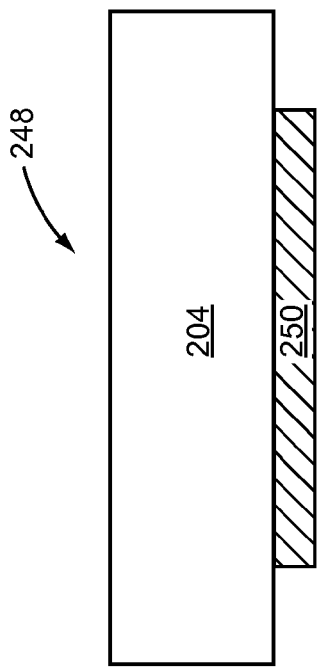
FIGS. 27-37 show a method of forming a MEMS device in accordance with one embodiment of the present invention.
Figure 28:
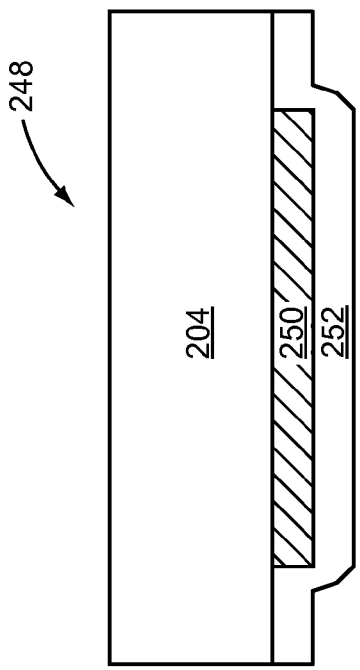
Figure 29:
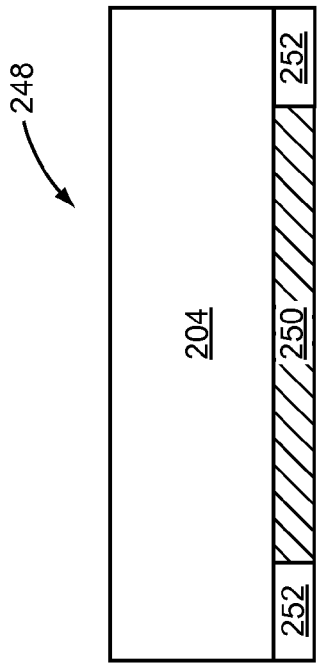

Now making reference to FIGS. 27-37, a method of forming a device 248 is shown in accordance with a further embodiment of the present invention. As will be detailed further on, in this embodiment, a bottom electrode is etched such that the bottom electrode corresponds to the top electrode, thereby reducing parasitic capacitances, which may degrade MEMS device sensitivity. In FIG. 27, initially, a sacrificial layer 250 is deposited on the substrate 204. The sacrificial layer 250 is then patterned such that the sacrificial layer 250 has the configuration shown with reference to FIG. 27. A field layer 252, which may be an oxide layer, is then deposited over the sacrificial layer 250 to cover the sacrificial layer 250 and fill a field layer immediately surrounding the sacrificial layer 250, as shown with reference to FIG. 28. Both the sacrificial layer 250 and the field layer 252 are planarized using a chemical mechanical polishing technique or any other well-known technique such that the device 248 has the configuration shown in FIG. 29.

Figure 30:
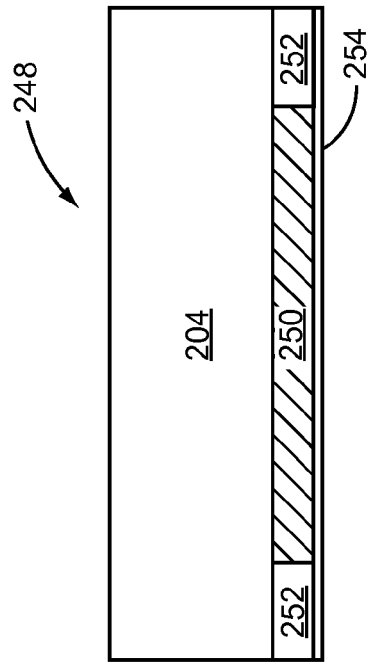
Figure 31:
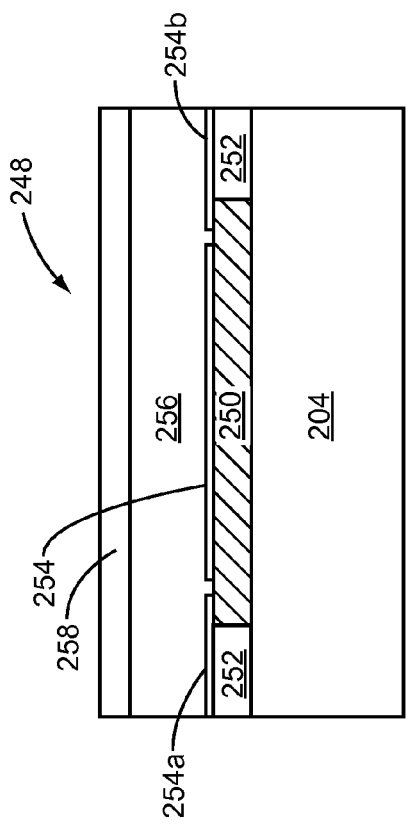

Upon planarization of both the sacrificial layer 250 and the field layer 252, a bottom electrode 254 is deposited over both the sacrificial layer 250 and the field layer 252, as shown in FIG. 30. In accordance with an embodiment of the present invention, the bottom electrode 254 may be Chromium or any other such metal and may be deposited to a thickness of about 0.1 microns (μm). After deposition, the bottom electrode 254 is patterned using any suitable technique such that the bottom electrode 254 has the configuration shown with reference to FIG. 31. Specifically, the bottom electrode 254 includes portions 254a and 254b. Here, the bottom electrode 254 has been pre-patterned prior to the formation of additional layers. In this embodiment, the bottom electrode 254 is pre-patterned in order to minimize parasitic capacitors.

Figure 32:
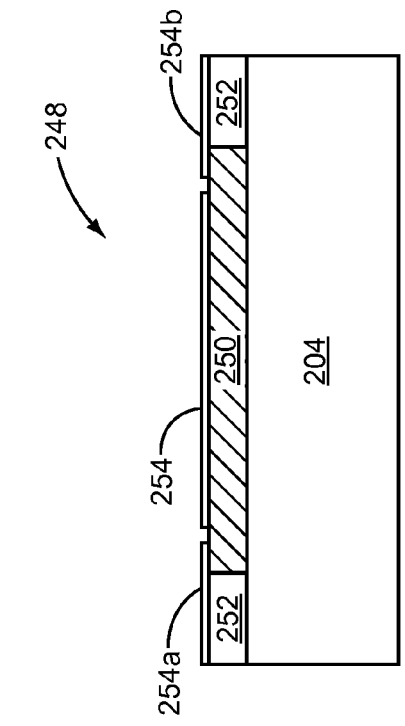
Figure 33:
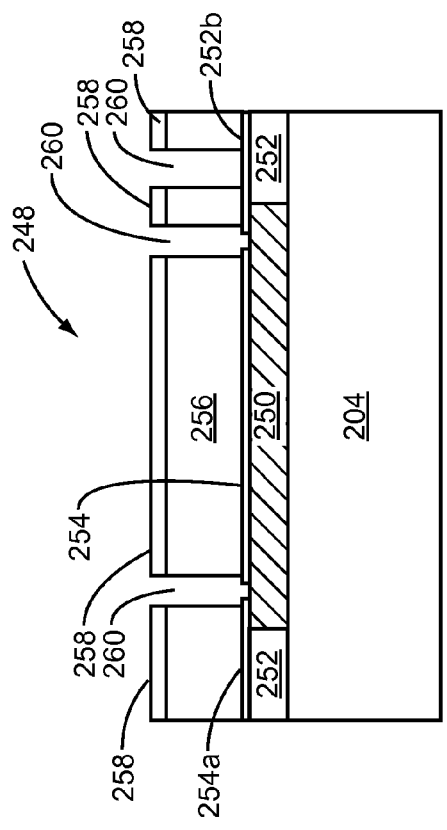
Figure 34:
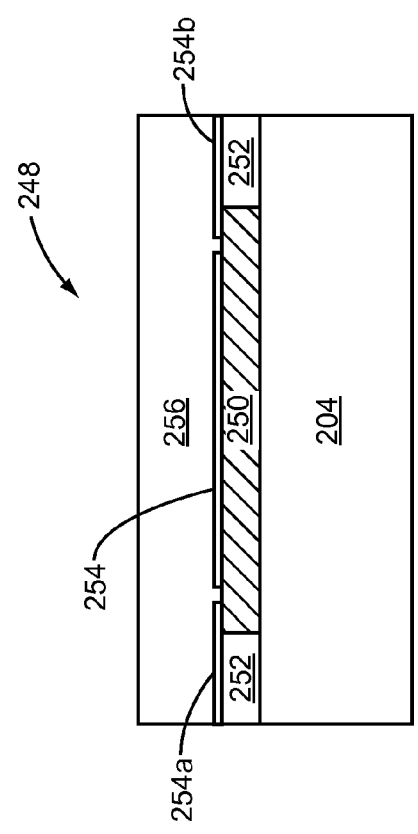
Figure 35:
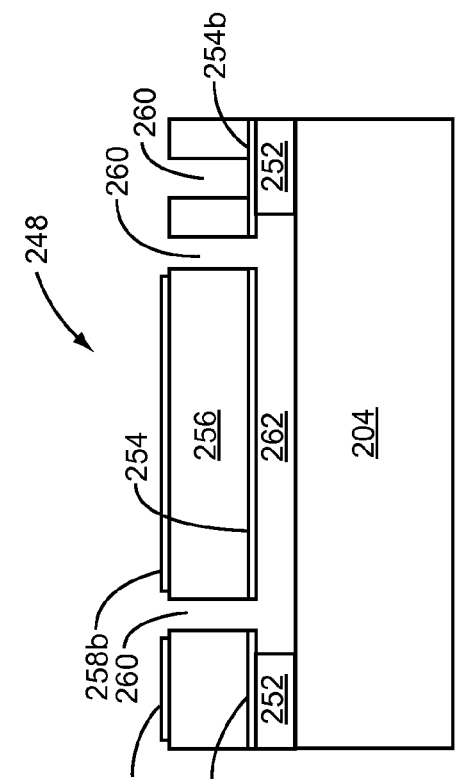

A MEMS structural layer 256 is then deposited over the bottom electrode 254 and the portions 254a and 254b to a thickness in a range of about 0.05_μm to about 5.0 μm, or preferably about one micron (1 μm), as shown with references to FIG. 32. The MEMS structural layer 256 may comprise a piezoelectric material deposited to a thickness of about one micron. In addition, the piezoelectric material may include Aluminum Nitride (AlN), Zinc Oxide (ZnO), or any PZT-based compounds. A top electrode 258 is then deposited over the MEMS structural layer 256, as shown in FIG. 33. The top electrode 258 may be formed from Chromium and may be deposited to a thickness of about 0.4 microns (μm). The top electrode may also be any other metal, such as, Aluminum, Molybdenum, Tungsten, Ruthenium, etc. The MEMS structural layer 256 is then patterned using the top electrode 258 as a hard mask such that the MEMS structural layer 256 has the configuration shown in FIG. 34. During patterning of the MEMS structural layer 256, paths 260 are formed in the MEMS structural layer 256. In an embodiment where the top electrode 258 does not function as a hard mask, the MEMS structural layer 256 may be patterned using any traditional photolithography technique. After the MEMS structural layer 256 is patterned, the bottom electrode 254 is etched a second time such that the bottom electrode 254 and the MEMS structural layer 256 are self-aligned, as shown in FIG. 35.

Figure 36:
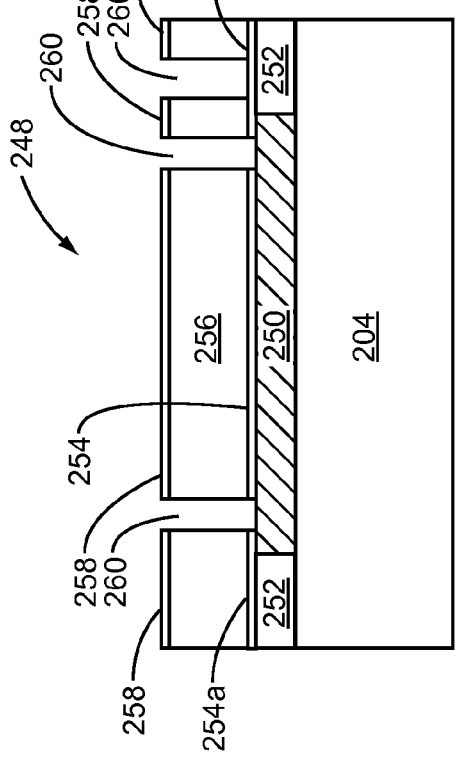
Figure 37:
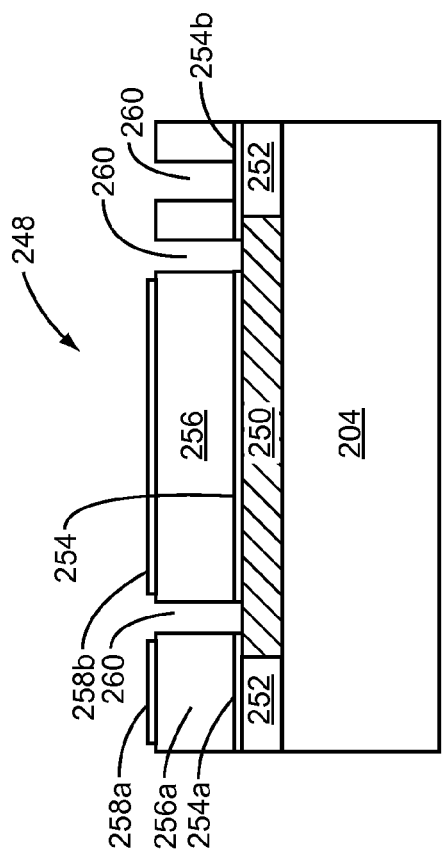

The top electrode 258 is then patterned using any conventional technique such that the top electrode 258 has the pattern shown in FIG. 36. After patterning of the top electrode 258, a MEMS device having the bottom and top electrodes 254 and 258 and the MEMS structural layer 256 is formed. As may be seen with reference to FIG. 36, the bottom electrode 254 and the top electrode 258 are patterned such that outside an active area between the top and bottom electrodes 254 and 258 where the active area between the top and bottom electrodes 254 and 258 is defined by the MEMS structural layer 256, overlap between the top and bottom electrodes 254 and 258 is minimized in order to reduce parasitic capacitance. Specifically, the top electrode 258 is patterned such that the bottom electrode 258 remains over the MEMS structural layer 256 and an anchor 256a of the MEMS structural layer 256. After patterning of the top electrode 258, the sacrificial layer 250 is released from the device 248 in a manner similar to that previously discussed, thereby forming a cavity 262, as shown in FIG. 37. The cavity 262 allows for movement of the MEMS device formed by the bottom and top electrodes 254 and 258 and the MEMS structural layer 256 during operation of the device 248.

Figure 39:
FIG. 39 is a Table illustrating how various etchants react with various sacrificial layers in accordance with one further embodiment of the present invention.

As previously discussed, the sacrificial layers used to form the devices described above are formed from a material that allows for release of the sacrificial layers when exposed to an etchant, while other portions of the devices, such as the field layers and the electrodes, are not released. According to an embodiment of the present invention, the specific material properties of the sacrificial material and the other portions of the device, along with the chemical properties of the etchant used to remove sacrificial material, allow for the selective release of the sacrificial material. FIGS. 38 and 39 illustrate tables 264 and 266, which describe various materials that may be used to form the sacrificial layers, the field layers, and the electrode layers noted above. Moreover, the tables 264 and 266 describe the etch rate of the various materials when a particular etchant is used to etch the sacrificial layers.

For example, the table 264 in FIG. 38 compares various materials 268 that may be used to form the sacrificial layers, the field layers, and the electrode layers noted above. Specifically, Silicon may be used for the sacrificial layer and either an oxide or a nitride may be used for the field layer. Moreover, Aluminum (Al), Titanium (Ti), Chromium (Cr), and Gold (Au) may be used for the electrode layers. Reference numeral 270 refers to how the various materials may be deposited, such as a thermal wet-oxidation process (Th-wet), Plasma Enhanced Chemical Vapor Deposition (PECVD), Low-Pressure Chemical Vapor Deposition (LPCVD), Sputtering, or any suitable evaporation technique (Evap).

Furthermore, reference numeral 272 refers to the type of etchants that may be used to release the sacrificial layers. As shown, various etchants, such as a silicon etchant, comprising 126 $HNO_3$:60$H_2O$:5 $NH_4F$, at 20° C. may be used, along with a Titanium etchant comprising 20 $H_2O$:1$H_2O_2$:1HF, at 20° C. may be used. In addition, phosphoric acid comprising $H_3PO_4$, at 85% volume, at 160° C. and Dilute Aqua Regia comprising 3 HCl:1 $HNO_3$:2 $H_2O$, at 30° C. may be used as etchants.

In addition, the Table 264 discloses the various etch rates 274 of the various materials when a particular etchant is used. For example, in an embodiment where Silicon is used as the sacrificial layer, an oxide deposited using PECVD is used for the field layer, and Gold is used as the material for the electrode; Potassium Hydroxide (KOH) may be used as the etchant. As may be seen in the Table 264, the sacrificial layer will etch at a rate of 1100 nm/min, while the oxide layer etches at a rate of about 15 nm/min, and the gold does not etch at all. Moreover, in an embodiment where Silicon is used as the sacrificial layer, an oxide deposited using PECVD is used for the field layer, and Chromium is used as the material for the electrode; Xenon Difluoride ($XeF_2$) may be used as the etchant. Furthermore, in an embodiment where Aluminum is used as the sacrificial layer, an oxide deposited using PECVD is used for the field layer, and Chromium is used as the material for the electrode; dilute aqua regia may be used as the etchant. Thus, the Table 264 shows various materials may be selected for the various layers described above based on the etch rates of the various materials using different etchants.

The Table 266 in FIG. 39 illustrates how various etchants react with various sacrificial layers, in accordance with a further embodiment of the present invention. In the embodiment shown in FIG. 39, the field layer may be an oxide and the electrodes may be Chromium (Cr). Specifically, various materials 276, such as Aluminum (Al), Titanium (Ti), and Vanadium may be selected as the material for the sacrificial layers described above. Furthermore, the various materials 276 have been deposited using techniques 278 noted in the Table 266. According to the Table 266, if Aluminum is used as the sacrificial material, Diluted Aqua Regia is a suitable etchant. Furthermore, if Titanium is used as the sacrificial material, an Al-etchant comprising 80% $H_3PO_4$+5% $HNO_3$+5% $CH_3COOH$+10% $H_2O$ at 50° C. may be used. In addition, if Titanium is used as the sacrificial material, a Ti-wet-etchant comprising 20 $H_2O$:1 $H_2O_2$:1 HF, at about 20° C. may used. If Vanadium is used for the sacrificial material, a silicon isotropic etchant having Trilogy 126 $HNO_3$:60 $H_2O$:5 $NH_4F$, at about 20° C. may used. If Amorphous Silicon is used as the material for the sacrificial layer, Xenon Difluoride ($XeF_2$) may be used as the etchant. In an embodiment where amorphous silicon is used and $XeF_2$ is used as the etchant, the etch rate may be about 2000 nm/min or higher.

Now making reference to FIGS. 40-43, a process flow for forming a planarized sacrificial layer for use with a MEMS device in accordance with a further embodiment of the present invention is shown. It should be noted that while only the formation of a planarized sacrificial layer is shown in FIGS. 40-43, a MEMS device may be formed over the planarized sacrificial layer, as discussed with reference to FIGS. 7-26 and 30-37 and the devices 200, 222, and 248. For ease of discussion, the formation of the planarized layer will be discussed in the context of the device 200. Nevertheless, the embodiment shown with reference to FIGS. 40-43 may also be formed with the devices 222 and 248. Initially, a field layer 282, such as an oxide layer, is deposited over the substrate 204 using any suitable technique, as shown with reference to FIG. 40. After deposition, the field layer 282 is then patterned such that the field layer 282 has the configuration shown in FIG. 41, where a cavity 282a is formed in the field layer 282. The field layer 282 may be patterned and subsequently etched using any suitable technique known in the art.

After patterning, a sacrificial layer 284 is deposited over the field layer 282 and within the cavity 282a using any well-known process, as shown with reference to FIG. 42. Upon deposition of the sacrificial layer 284, both the field layer 282 and the sacrificial layer 284 are planarized using any suitable technique, including chemical mechanical polishing, or the like, such that the field layer 282 and the sacrificial layer 284 have a planarized configuration, as shown in FIG. 43. In particular, both the field layer 282 and the sacrificial layer are planar with respect to each other. As such, a MEMS device is formed over the planarized field layer 282 and the sacrificial layer 284 as detailed with respect to FIGS. 7-26 and 30-37 and the devices 200, 222, and 248. It should be noted that the field layer 282 and the sacrificial layer 284 may be formed with the materials described with reference to FIGS. 38 and 39 and the Tables 264 and 266. For example, the sacrificial material may be formed with silicon and the field layer may be an oxide layer formed using PECVD.

Figure 44:
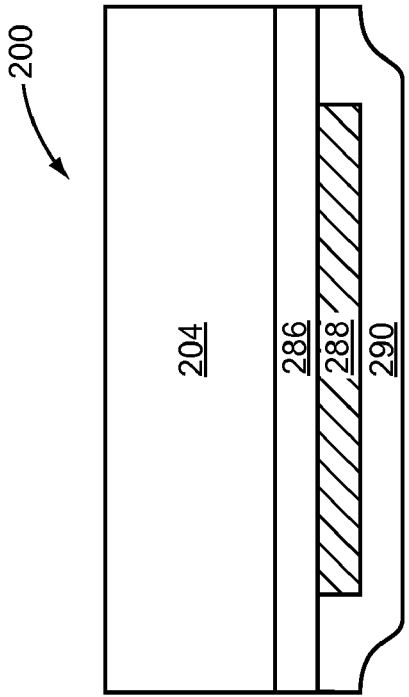
FIGS. 44-47 show a process flow of forming a planarized sacrificial layer for use with a MEMS device in accordance with another embodiment of the present invention.

In addition to the embodiment shown with reference to FIGS. 40-43, FIGS. 44-47 demonstrate a process flow for forming a planarized sacrificial layer for use with a MEMS device in accordance with another embodiment of the present invention. It should be noted that while only the formation of a planarized sacrificial layer is shown in FIGS. 44-47, a MEMS device may be formed over the planarized sacrificial layer, as discussed with reference to FIGS. 7-26 and 30-37 and the devices 200, 222, and 248. For ease of discussion, the formation of the sacrificial planarized layer will be discussed in the context of the device 200. Nevertheless, the embodiment shown with reference to FIGS. 44-47 may also be formed with the devices 222 and 248. Initially, a field layer 286, such as an oxide layer, is deposited over the substrate 204 and a sacrificial layer 288 is deposited over the field layer 286, as shown in FIG. 44. The sacrificial layer 288 is then patterned and etched such that the sacrificial layer 288 has the configuration shown with reference to FIG. 45. The sacrificial layer 288 may be patterned and subsequently etched using any suitable technique known in the art.

Figure 46:
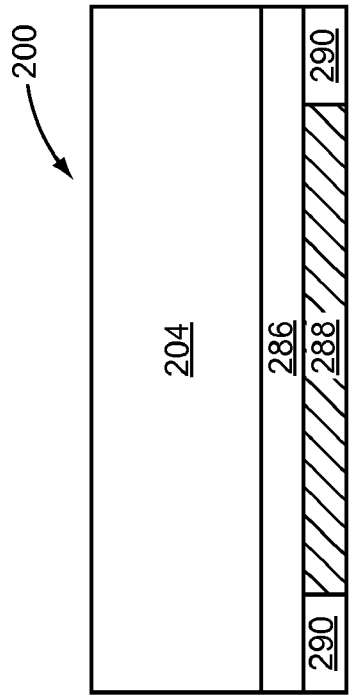
Figure 45:
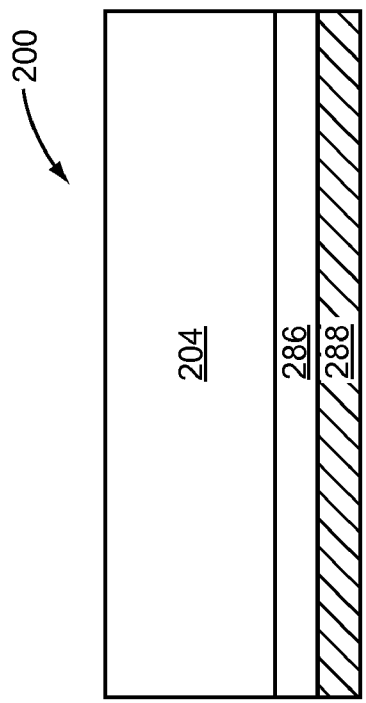
Figure 47:
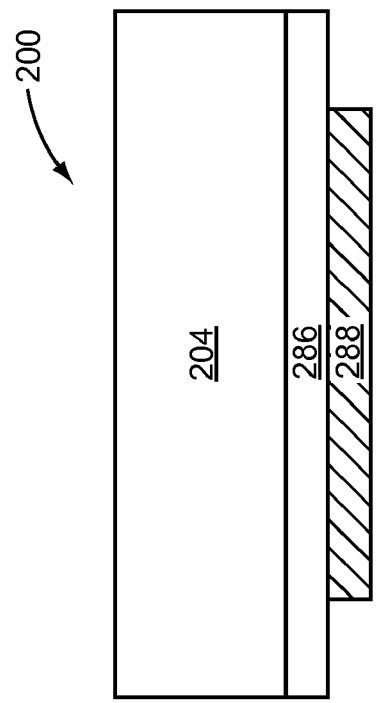
Figure 48:
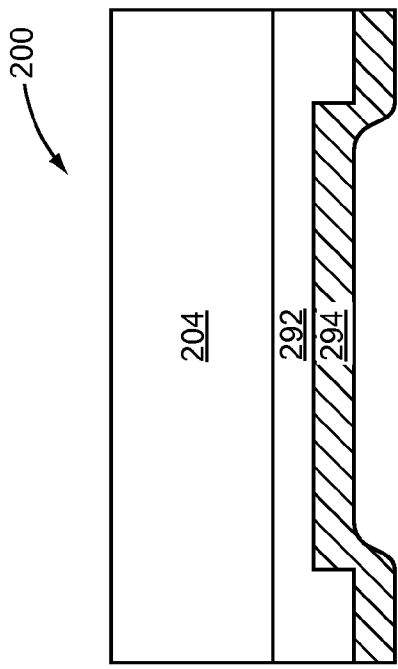

Subsequent to the deposition and patterning of the sacrificial layer 288, an additional field layer 290, such as an additional oxide layer, is deposited over both the field layer 286 and the sacrificial layer 288 such that the additional field layer 290 contacts the field layer 286 and the sacrificial layer 288, as shown with reference to FIG. 46. Upon deposition of the additional field layer 290, the additional field layer 290 is planarized using any suitable technique, including chemical mechanical polishing, or the like, such that the additional field layer 290 has a planarized configuration, as shown in FIG. 47. It should be noted that the sacrificial layer 288 may also be planarized during planarization of the additional field layer 290. Here, the additional field layer 290 is planarized such that the sacrificial layer 288 and the additional field layer 290 form a planar surface where a MEMS device, as discussed with reference to FIGS. 7-26 and 30-37 and the devices 200, 222, and 248 may be formed over the planarized surface that includes both the sacrificial layer 288 and the additional field layer 290. It should be noted that the field layer 286, the sacrificial layer 288, and the additional field layer 290 may be formed with the materials described with reference to FIGS. 38 and 39 and the Tables 264 and 266. For example, the sacrificial material may be formed with silicon and the field layers may be oxide layers formed using PECVD.

Figure 49:
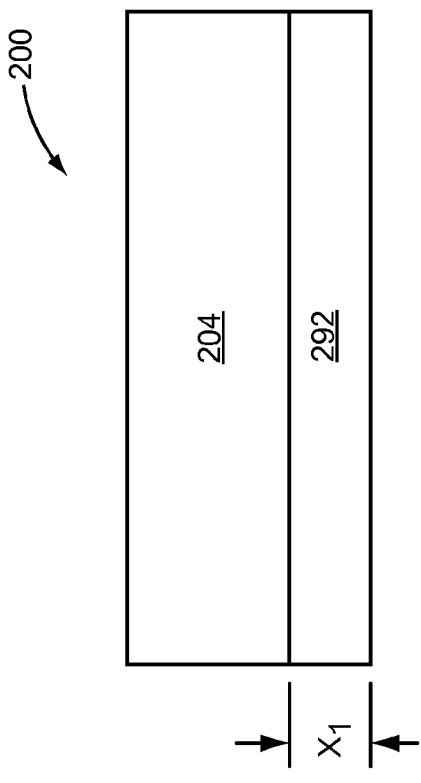

Now making reference to FIGS. 48-51, the formation of a planarized sacrificial layer is shown in accordance with another embodiment of the present invention. It should be noted that while only the formation of a planarized sacrificial layer is shown in FIGS. 48-51, a MEMS device may be formed over the planarized sacrificial layer, as discussed with reference to FIGS. 7-26 and 30-37 and the devices 200, 222, and 248. For ease of discussion, the formation of the sacrificial planarized layer will be discussed in the context of the device 200. Nevertheless, the embodiment shown with reference to FIGS. 48-51 may also be formed with the devices 222 and 248. Initially, a field layer 292, such as an oxide layer, is formed over the substrate 204 to a depth of $X_1$, as shown with reference to FIG. 48. The field layer 292 may be formed to the depth $X_1$ using any suitable deposition technique. The field layer 292 is then patterned such that a cavity 292a is formed in the field layer 292, as shown with reference to FIG. 49. The cavity 292a may be patterned and subsequently etched using any suitable technique known in the art. Moreover, the cavity 292a may be patterned and etched such that the cavity 292a is formed to a depth $X_2$, as shown in FIG. 49, where a portion of the field layer 292 remains between the cavity 292a and the substrate 204.

Figure 50:
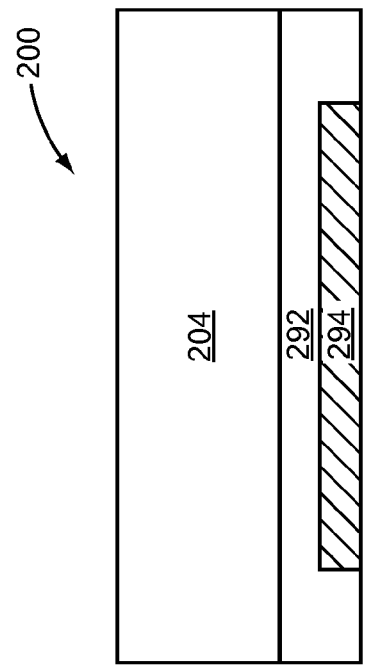
Figure 51:
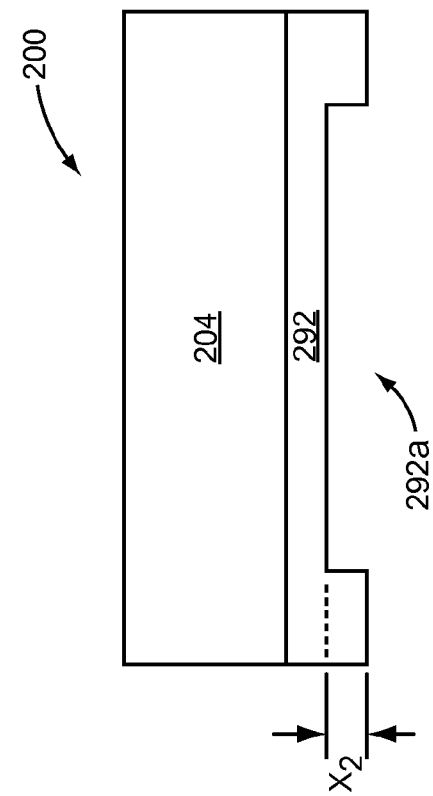

Once the cavity 292a is formed in the field layer 292, a sacrificial layer 294 is deposited over the field layer 292 and the cavity 292a, as shown in FIG. 50. The sacrificial layer 294 may be deposited using any well known technique. Upon deposition of the sacrificial layer 294, the sacrificial layer 294 is planarized using any suitable technique, including chemical mechanical polishing, or the like, such that the sacrificial layer 294 has a planarized configuration, as shown in FIG. 51. In particular, both the field layer 292 and the sacrificial layer 294 are planar with respect to each other. As such, a MEMS device is formed over the planarized field layer 292 and the sacrificial layer 294 as detailed with respect to FIGS. 7-26 and 30-37 and the devices 200, 222, and 248. It should be noted that the field layer 292 and the sacrificial layer 294 may be formed with the material described with reference to FIGS. 38 and 39 and the Tables 264 and 266. For example, the sacrificial material may be formed with silicon and the field layer may be an oxide layer formed using PECVD.

An example of a MEMS device formed over the planarized field layer 292 is shown with reference to FIG. 52. Here, the MEMS device includes a component having a first electrode defined by the portions 212a, 212b, and 212c and the top electrode 218. In addition, the component includes the single crystal wafer 214 disposed between the electrodes 212 and 218 having the anchors 214a and 214b. In the embodiment shown in FIG. 52, the sacrificial layer 294 has been released. In particular, after formation of the MEMS device using the processes detailed above, the sacrificial layer 294 is released using the techniques described above thereby forming the cavity 206. As such, the component may freely move within the cavity 206 during operation.

Now making reference to FIG. 53, an example of a MEMS device formed over the planarized field layers 286 and 290 is shown in accordance with a further embodiment of the present invention. In this embodiment, the MEMS device includes a component having a first electrode defined by the portions 212a, 212b, and 212c, and the top electrode 218. Here, the component has the single crystal wafer 214 disposed between the electrodes 212 and 218. The single crystal wafer 214 also includes the anchors 214a and 214b. In this embodiment, the sacrificial layer 288 has been released. More specifically, after formation of the MEMS device using the processes previously described above, the sacrificial layer 288 is released using the techniques described above thereby forming the cavity 206. As such, the component may freely move within the cavity 206 during operation.

Those skilled in the art will recognize improvements and modifications to the preferred embodiments of the present invention. All such improvements and modifications are considered within the scope of the concepts disclosed herein and the claims that follow.

The invention claimed is:
1. A device formed by a process comprising:
providing a substrate;
forming a sacrificial layer over the substrate;
forming a field layer around the sacrificial layer;
planarizing the sacrificial layer and the field layer;
forming a component over the planarized sacrificial layer and the planarized field layer, the component having a first electrode and a second electrode and a single crystal wafer disposed between the first electrode and the second electrode, wherein the component includes anchors disposed substantially over the field layer; and
releasing the sacrificial layer with an etchant having a selectivity for the sacrificial layer, thereby forming a cavity beneath the component, where the component freely moves within the cavity during operation of the device, wherein the etchant does not release the field layer and the component such that the field layer remains below and in contact with the anchors and the anchors remain stationary during operation of the device.

2. The device of claim 1, wherein the single crystal wafer is a piezoelectric material.

3. The device of claim 2 wherein the single crystal wafer is lithium tantalate.

4. The device of claim 2, wherein the single crystal wafer is lithium niobate.

5. The device of claim 1, wherein the second electrode functions as a hard mask during the formation of the component.

6. The device of claim 5, wherein the step of forming the component further comprises patterning the first electrode and the single crystal wafer such that the first electrode and the single crystal wafer are self-aligned.

7. The device of claim 1, wherein the field layer is formed from a material different from the sacrificial layer.

8. The device of claim 1, wherein the first electrode and second electrode are formed from a material different from the sacrificial layer.

9. The device of claim 1, wherein the sacrificial material is silicon.

10. The device of claim 9, wherein the first electrode and the second electrode are formed from gold.

11. The device of claim 10, wherein the etchant is Potassium Hydroxide (KOH).

12. The device of claim 1, wherein the field layer is an oxide layer.

13. The device of claim 1, wherein the sacrificial material is Silicon.

14. The device of claim 13, wherein the first electrode and the second electrode are formed from Chromium.

15. The device of claim 14, wherein the etchant is Xenon Difluoride ($XeF_2$).

16. The device of claim 1, wherein the sacrificial material is Aluminum.

17. The device of claim 16, wherein the first electrode and the second electrode are formed from Chromium.

18. The device of claim 17, wherein the etchant is dilute aqua regia.

* * * * *